US012021018B2

United States Patent
Huang et al.

(10) Patent No.: US 12,021,018 B2
(45) Date of Patent: Jun. 25, 2024

(54) CONDUCTIVE CIRCUIT CARRIER MODULE

(71) Applicant: INDUSTRIAL TECHNOLOGY RESEARCH INSTITUTE, Hsinchu (TW)

(72) Inventors: Yu-Wei Huang, Chiayi (TW); Shau-Fei Cheng, Pingtung County (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 89 days.

(21) Appl. No.: 17/694,445

(22) Filed: Mar. 14, 2022

(65) Prior Publication Data
US 2023/0170288 A1    Jun. 1, 2023

(30) Foreign Application Priority Data

Dec. 1, 2021  (TW) ................... 110144829

(51) Int. Cl.
*H01L 23/498*   (2006.01)
(52) U.S. Cl.
CPC .. *H01L 23/49838* (2013.01); *H01L 23/49816* (2013.01)
(58) Field of Classification Search
CPC ........... H05K 1/11–115; H05K 1/0298; H05K 1/144; H01L 23/49838; H01L 23/49816; H01L 23/49822
See application file for complete search history.

(56) References Cited

U.S. PATENT DOCUMENTS

| 9,263,373 | B2 | 2/2016 | Hu |
| 9,543,249 | B1 | 1/2017 | Hu |
| 10,043,758 | B1 | 8/2018 | Lee et al. |
| 10,510,674 | B2 | 12/2019 | Lin et al. |
| 2003/0178229 | A1* | 9/2003 | Toyoda ................ H05K 3/4688 174/261 |

(Continued)

FOREIGN PATENT DOCUMENTS

| CN | 107170730 B | 5/2020 |
| TW | 202006914 A | 2/2020 |

(Continued)

OTHER PUBLICATIONS

TW Office Action in Application No. 110144829 Dated Jul. 12, 2022.

*Primary Examiner* — Timothy J Thompson
*Assistant Examiner* — Harmandeep Singh
(74) *Attorney, Agent, or Firm* — Maschoff Brennan

(57) ABSTRACT

This disclosure provides a conductive circuit carrier module including a carrier and a conductive circuit film layer. The conductive circuit film layer is disposed on the carrier. The conductive circuit film layer has at least one conductive circuit structure including a vertical wire part and at least four horizontal wire parts. The vertical wire part extends along a thickness direction of the conductive circuit film layer. The at least four horizontal wire parts are connected to one another via the vertical wire part and extend along a direction substantially perpendicular to the vertical wire part. The at least four horizontal wire parts are symmetrically arranged or asymmetrically arranged with respect to the vertical wire part.

17 Claims, 9 Drawing Sheets

(56) References Cited

U.S. PATENT DOCUMENTS

| | | | |
|---|---|---|---|
| 2017/0103944 A1* | 4/2017 | Fukui | ................ H01L 23/49827 |
| 2020/0077510 A1* | 3/2020 | Darveaux | .............. H05K 1/113 |
| 2021/0225699 A1 | 7/2021 | Tseng et al. | |

FOREIGN PATENT DOCUMENTS

| | | |
|---|---|---|
| TW | 202010077 A | 3/2020 |
| TW | 202129855 A | 8/2021 |

* cited by examiner

CONDUCTIVE CIRCUIT CARRIER MODULE

CROSS-REFERENCE TO RELATED APPLICATIONS

This non-provisional application claims priority under 35 U.S.C. § 119(a) on Patent Application No(s). 110144829 filed in Taiwan, R.O.C. on Dec. 1, 2021, the entire contents of which are hereby incorporated by reference.

TECHNICAL FIELD

The disclosure relates to a carrier and relates to a conductive circuit carrier module.

BACKGROUND

With technology develops, semiconductor flip chip package or multi-chip module package such as artificial intelligence (AI) chips, high-end chips, and multi-chips trends to be applied to fields, such as 5G telecommunication, augmented reality (AR), and virtual reality (VR). In order to the demands, the package size and the number of stacked layers are becoming greater than ever, thereby leading to a higher density, narrower intervals, and more contact points of circuits. Meanwhile, more and more smartphones adopt carrier boards with thinner circuits rather than high-density interconnect (HDI) technique.

However, due to the manufacturing limitations, the fine circuit distribution layer is so thin that it is easily deformed by unevenly thermal expansion in different directions. Also, the existence of the fixation of the contact points tends to result in warpage on the fine circuit distribution layer and thereby significantly affecting the flatness of the carrier that supports the fine circuit distribution layer and the later applications.

SUMMARY

According to one aspect of the disclosure, a conductive circuit carrier module includes a carrier and a conductive circuit film layer. The conductive circuit film layer is disposed on the carrier. The conductive circuit film layer has at least one conductive circuit structure including a vertical wire part and at least four horizontal wire parts. The vertical wire part extends along a thickness direction of the conductive circuit film layer. The at least four horizontal wire parts are connected to one another via the vertical wire part and extend along a direction substantially perpendicular to the vertical wire part. The at least four horizontal wire parts are symmetrically arranged or asymmetrically arranged with respect to the vertical wire part.

According to another aspect of the disclosure, a conductive circuit carrier module includes a carrier and a conductive circuit film layer. The conductive circuit film layer is disposed on the carrier. The conductive circuit film layer has at least one conductive circuit structure including a vertical wire part and at least four horizontal wire parts. The vertical wire part extends along a thickness direction of the conductive circuit film layer. The at least four horizontal wire parts are connected to one another via the vertical wire part and extend along a direction substantially perpendicular to the vertical wire part. At least two of the at least four horizontal wire parts are different in length.

According to further another aspect of the disclosure, a conductive circuit carrier module includes a carrier and a conductive circuit film layer. The conductive circuit film layer is disposed on the carrier. The conductive circuit film layer has at least one conductive circuit structure including a vertical wire part and at least four horizontal wire parts. The vertical wire part extends along a thickness direction of the conductive circuit film layer. The at least four horizontal wire parts are connected to one another via the vertical wire part and extend along a direction substantially perpendicular to the vertical wire part. Two of the at least four horizontal wire parts that are respectively located closest to the carrier and located farthest away from the carrier are outer wire parts, at least two of the at least four horizontal wire parts that are located between the outer wire parts are inner wire parts, and a ratio of areas of the outer wire parts to areas of the at least four horizontal wire parts is less than a ratio of areas of the inner wire parts to the areas of the at least four horizontal wire parts.

BRIEF DESCRIPTION OF THE DRAWINGS

The disclosure will become more fully understood from the detailed description given hereinbelow and the accompanying drawings which are given by way of illustration only and thus are not intending to limit the disclosure and wherein.

DETAILED DESCRIPTION OF THE EMBODIMENTS

Aspects and advantages of the invention will become apparent from the following detailed descriptions with the accompanying drawings. For purposes of explanation, one or more specific embodiments are given to provide a thorough understanding of the invention, and which are described in sufficient detail to enable one skilled in the art to practice the described embodiments. It should be understood that the following descriptions are not intended to limit the embodiments to one specific embodiment. On the contrary, it is intended to cover alternatives, modifications, and equivalents as can be included within the spirit and scope of the described embodiments as defined by the appended claims.

Figure 1:
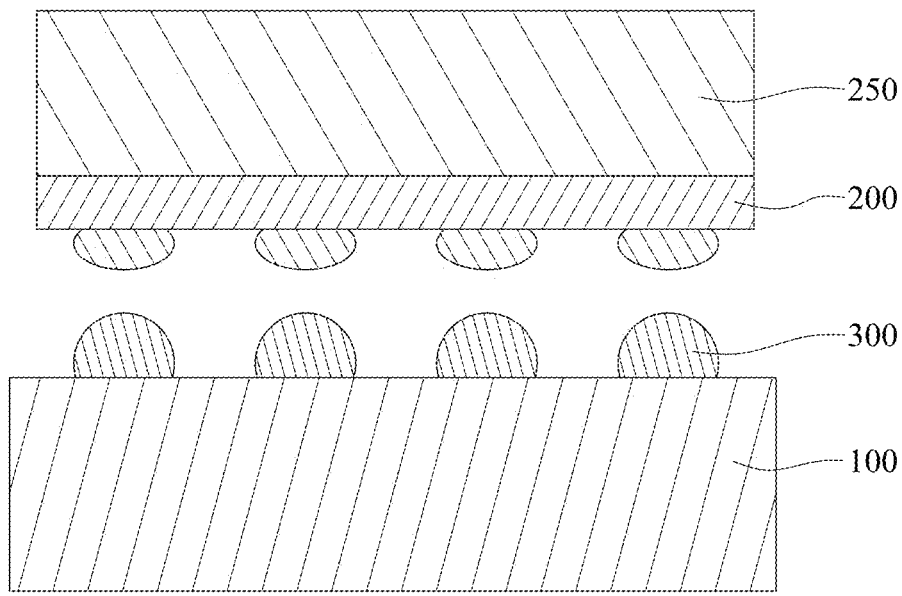
FIG. 1 to FIG. 3 are schematic views showing processes of manufacturing a conductive circuit carrier module according to a first embodiment of the disclosure.
Figure 2:
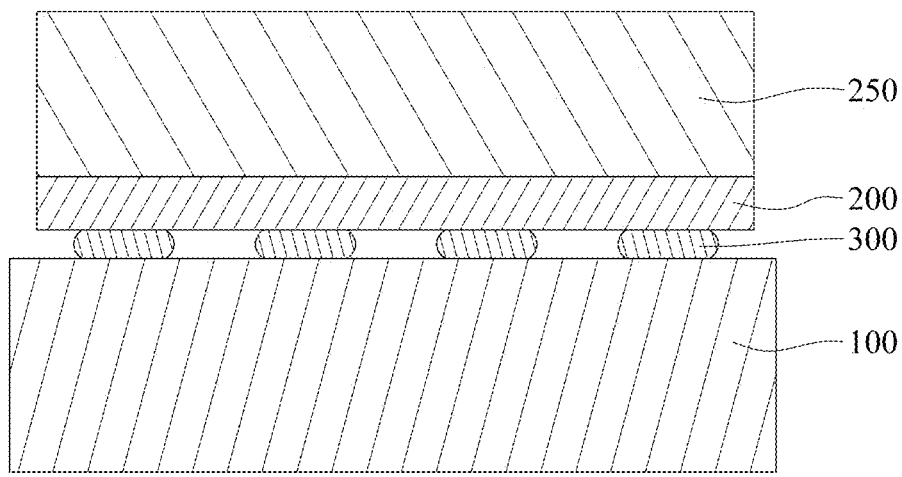
Figure 3:
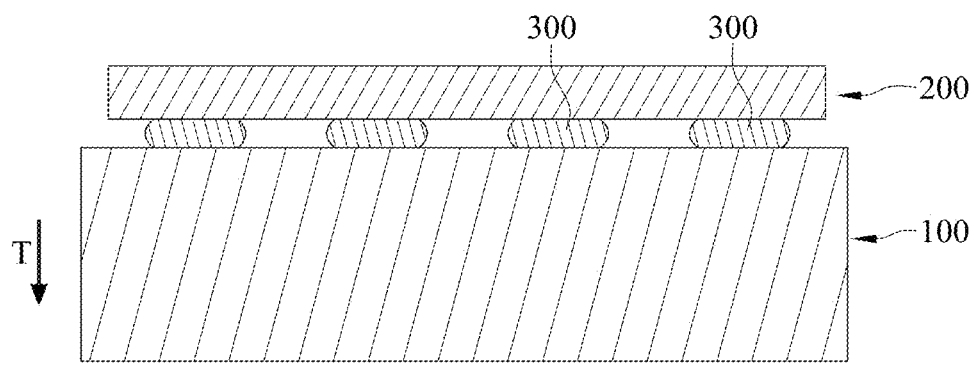
Figure 4:
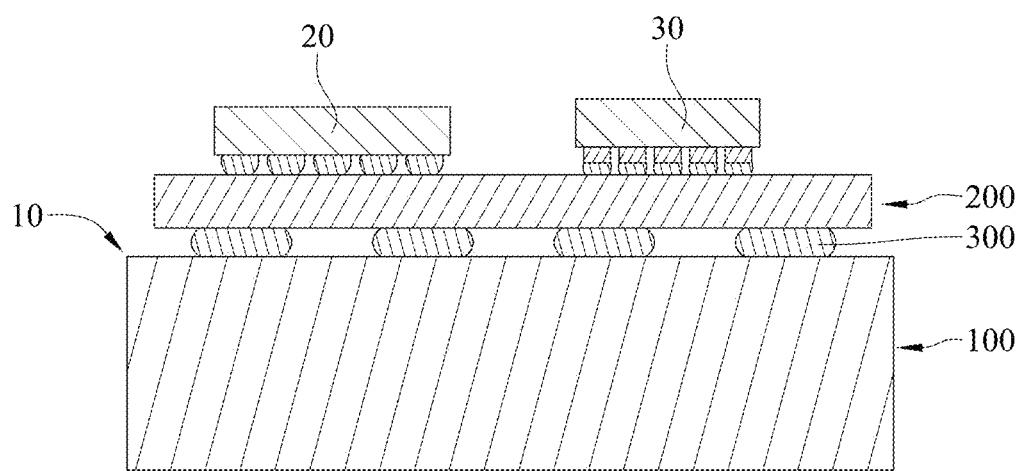
FIG. 4 is a schematic view of the conductive circuit carrier module of FIG. 3 with chips disposed thereon.
Figure 5:
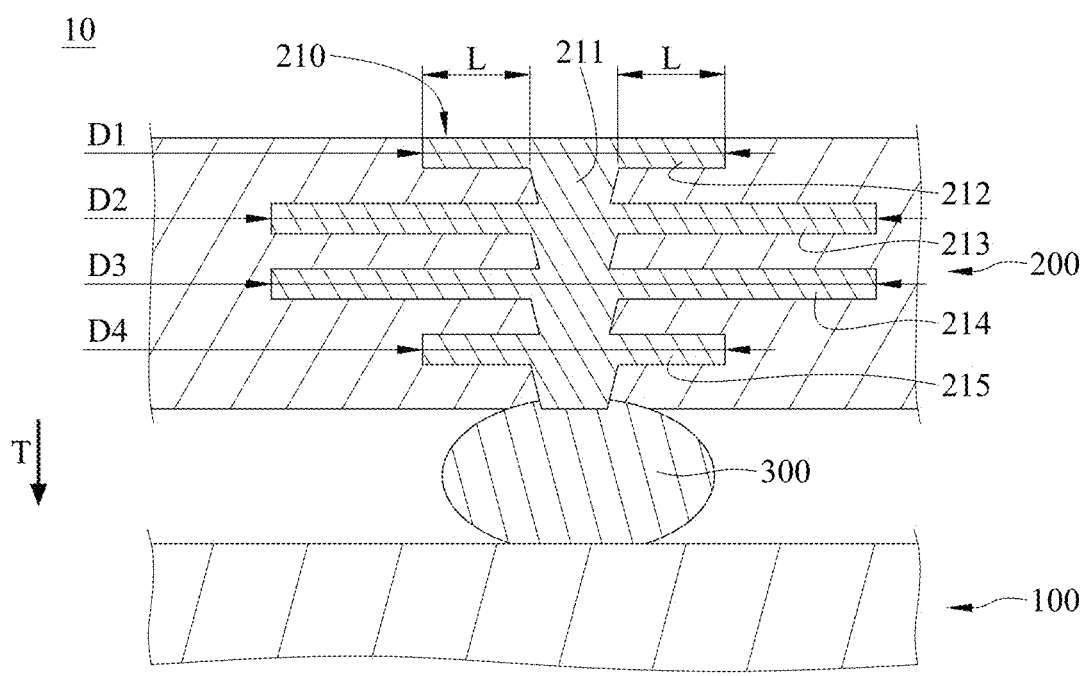
FIG. 5 is a partial and enlarged view of the conductive circuit carrier module of FIG. 3.

Please refer to FIG. 1 to FIG. 5, where FIG. 1 to FIG. 3 are schematic views showing processes of manufacturing a conductive circuit carrier module 10 according to a first embodiment of the disclosure, FIG. 4 is a schematic view of the conductive circuit carrier module 10 of FIG. 3 with chips 20 and 30 disposed thereon, and FIG. 5 is a partial and enlarged view of the conductive circuit carrier module 10 of FIG. 3.

The conductive circuit carrier module 10 provided in one embodiment may be applied in, for example, a 2.5D integrated circuit (IC), a 3D IC, a system in package (SiP) or a package on package (PoP) system. The conductive circuit carrier module 10 includes a carrier 100 and a conductive circuit film layer 200. The process of manufacturing the conductive circuit carrier module 10 are illustrated in FIGS. 1 and 2. As shown, the conductive circuit film layer 200 is disposed on a substrate 250 and is soldered to the carrier 100 via, for example, one or more solder balls. Then, as shown in FIG. 3, the substrate 250 which is used for supporting the conductive circuit film layer 200 is removed, thereby obtained a conductive circuit carrier module 10. Then, as shown in FIG. 4, the chips 20 and 30 are disposed on the conductive circuit film layer 200 via, for example, one or more solder balls.

The carrier 100 as illustrated in an exemplary embodiment may be a printed circuit board or a carrier (e.g., glass substrate) with a circuit. The conductive circuit film layer 200 is disposed on and electrically connected to the carrier 100. In the embodiment, the conductive circuit carrier module 10 may further include a plurality of conductive structures 300. The conductive structures 300 may be solder balls. The conductive circuit film layer 200 is electrically connected to a conductive circuit (not shown) of the carrier 100 via the conductive structures 300.

In the embodiment, as shown in FIG. 5, the conductive circuit film layer 200 has a conductive circuit structure 210 electrically connected to the conductive circuit of the carrier 100 via one of the conductive structures 300. The conductive circuit structure 210 may be made of copper. The conductive circuit structure 210 includes a vertical wire part 211 and a plurality of horizontal wire parts 212, 213, 214 and 215. The vertical wire part 211 extends along a thickness direction T of the conductive circuit film layer 200 and can be served as a via. The horizontal wire parts 212, 213, 214 and 215 each extend outward from the vertical wire part 211 along a direction substantially perpendicular to the vertical wire part 211. In other words, the horizontal wire parts 212, 213, 214 and 215 extend along a direction substantially perpendicular to the thickness direction T, the horizontal wire parts 212, 213, 214 and 215 are connected to one another via the vertical wire part 211, and the vertical wire part 211 can be served as a supporter for the horizontal wire parts 212, 213, 214 and 215. In one embodiment, for example, the horizontal wire parts 212, 213, 214, and 215 may be four parts. The horizontal wire parts 212, 213, 214, and 215 may include a first horizontal wire part 212, a second horizontal wire part 213, a third horizontal wire part 214, and a fourth horizontal wire part 215. The first horizontal wire part 212 is located farther away from the carrier 100 than the second horizontal wire part 213, the second horizontal wire part 213 is located farther away from the carrier 100 than the third horizontal wire part 214, and the third horizontal wire part 214 is located farther away from the carrier 100 than the fourth horizontal wire part 215. In other words, the first horizontal wire part 212 is the farthest from the carrier 100, the fourth horizontal wire part 215 is the closest to the carrier 100, and the second horizontal wire part 213 and the third horizontal wire part 214 are located between the first horizontal wire part 212 and the fourth horizontal wire part 215.

In one embodiment, the conductive structure 300 may be a copper-core solder ball or a solder ball with an under bump metallurgy (UBM).

In FIG. 5, D1 denotes to the length of the first horizontal wire part 212, D2 denotes to the length of the second horizontal wire part 213, D3 denotes to the length of the third horizontal wire part 214, D4 denotes to the length of the fourth horizontal wire part 215, and D1:D2:D3:D4=1:2:2:1. This arrangement of the horizontal wire parts 212, 213, 214, and 215 is favorable for reducing or preventing unwanted warpage from occurring on the conductive circuit film layer 200. In other words, the arrangement of the horizontal wire parts 212, 213, 214, and 215 enhances the flatness of the surface of the conductive circuit film layer 200 of the conductive circuit carrier module 10, for example, the warpage less than 200 um, thereby optimizing or facilitating the later process, such as chip installation.

In one embodiment, the horizontal wire parts 212, 213, 214, and 215 are arranged symmetrical with respect to the vertical wire part 211. Taking the first horizontal wire part 212 in FIG. 5 as an example, the first horizontal wire part 212 is aligned its center with the vertical wire part 211 so that the first horizontal wire part 212 protrudes from two opposite sides of the vertical wire part 211 by the same length of L, but the lengths thereof are not limiting. The horizontal wire parts may not be symmetrically arranged with respect to the vertical wire part. In some other embodiments, at least one of the horizontal wire parts may be arranged asymmetric with respect to the vertical wire part so that the horizontal wire part protrudes from two opposite sides of the vertical wire part by different lengths.

In one embodiment, the horizontal wire parts 212, 213, 214, and 215 may be the same in thickness, but the thicknesses thereof are not limiting. In some other embodiments, the horizontal wire parts may be different in thickness. In one embodiment, any two adjacent horizontal wire parts 212, 213, 214, and 215 may be spaced by a fixed interval. In some other embodiments, the horizontal wire parts may have different intervals therebetween.

The previous embodiments illustrate four horizontal wire parts in one conductive circuit film layer, but the number of the horizontal wire parts in the conductive circuit film layer is not limiting. In some other embodiments, the conductive circuit film layer may have any number of horizontal wire parts as required.

The previous embodiments illustrate one conductive circuit structure 210 corresponding to one conductive structure 300, but the disclosure is not limited to the one-to-one corresponding relationship therebetween. In some other embodiment, the conductive circuit structure may correspond to all conductive structures or at least part of all conductive structures. The corresponding relationship therebetween may refer to the electrical connection formed by the conductive circuit structure in direct or indirect contact with the conductive structure. Further, in some other embodiments, each of the quantity of the conductive circuit structure and the conductive structure may be any number as required.

Figure 6:
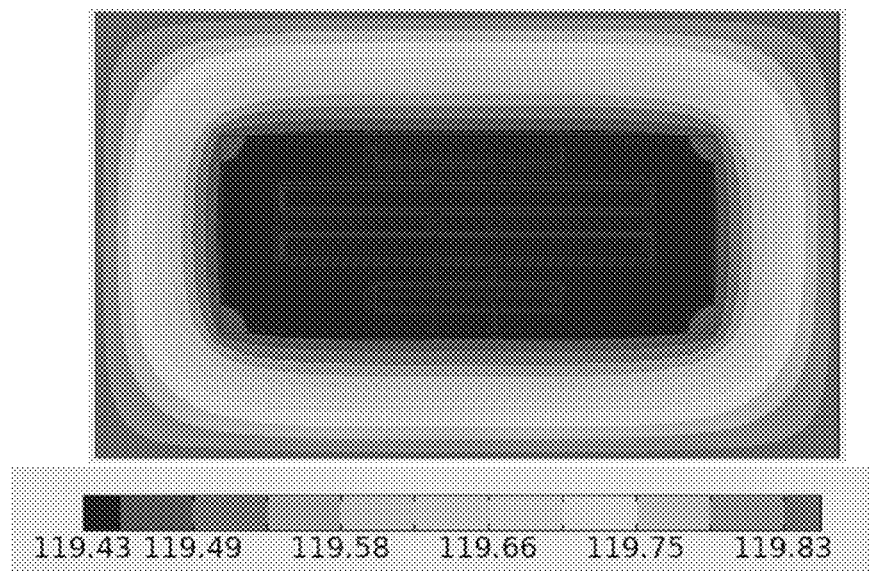
FIG. 6 to FIG. 8 depict the simulations of the conductive circuit carrier module of FIG. 5.
Figure 7:
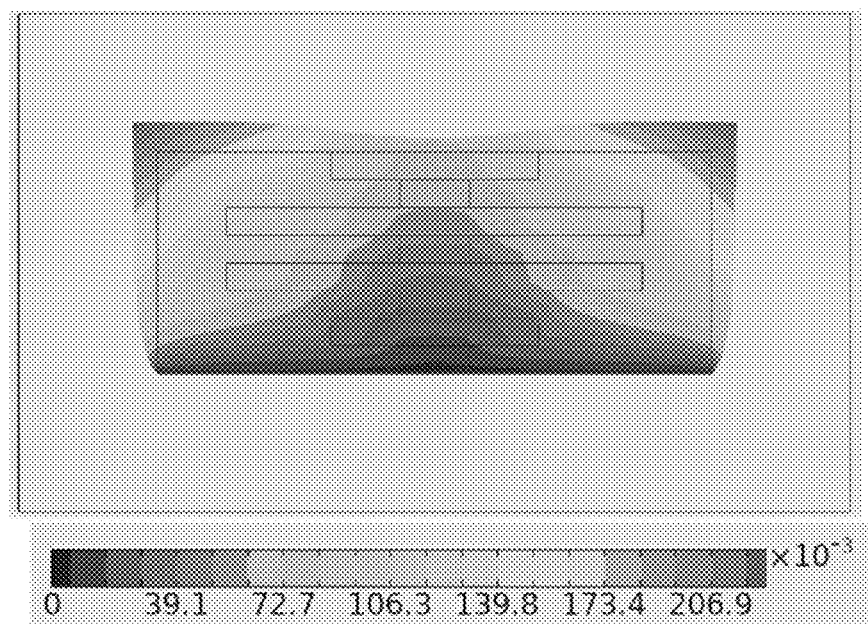
Figure 8:
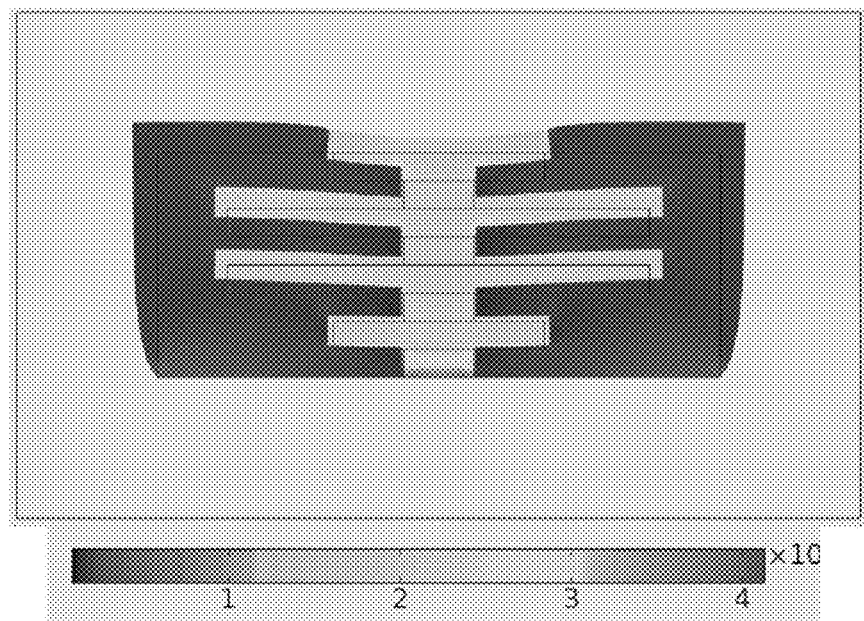

Then, please see the simulations of the conductive circuit carrier module 10 as illustrated in FIGS. 6-8, where FIG. 6 shows a temperature distribution of the conductive circuit carrier module 10, FIG. 7 shows a displacement distribution of the conductive circuit carrier module 10, and FIG. 8 shows a stress distribution of the conductive circuit carrier module 10.

In FIG. 6, the temperature at the conductive circuit structure 210 of the conductive circuit film layer 200 is about 119.43 degrees Celsius. In FIG. 7, the displacement at a side of the conductive circuit film layer 200 located close to the conductive structure 300 is about 0 micrometer (um), and the displacement at a side of the conductive circuit film layer 200 located away from the conductive structure 300 is about 0.140 micrometers. In FIG. 8, from a side of the conductive circuit structure 210 of the conductive circuit film layer 200 located close to the conductive structure 300 to the other side of the conductive circuit structure 210 of the conductive circuit film layer 200 located away from the conductive structure 300, the stress applied thereto gradually decreases from about 40 N/m² to about 20 N/m².

Figure 9:
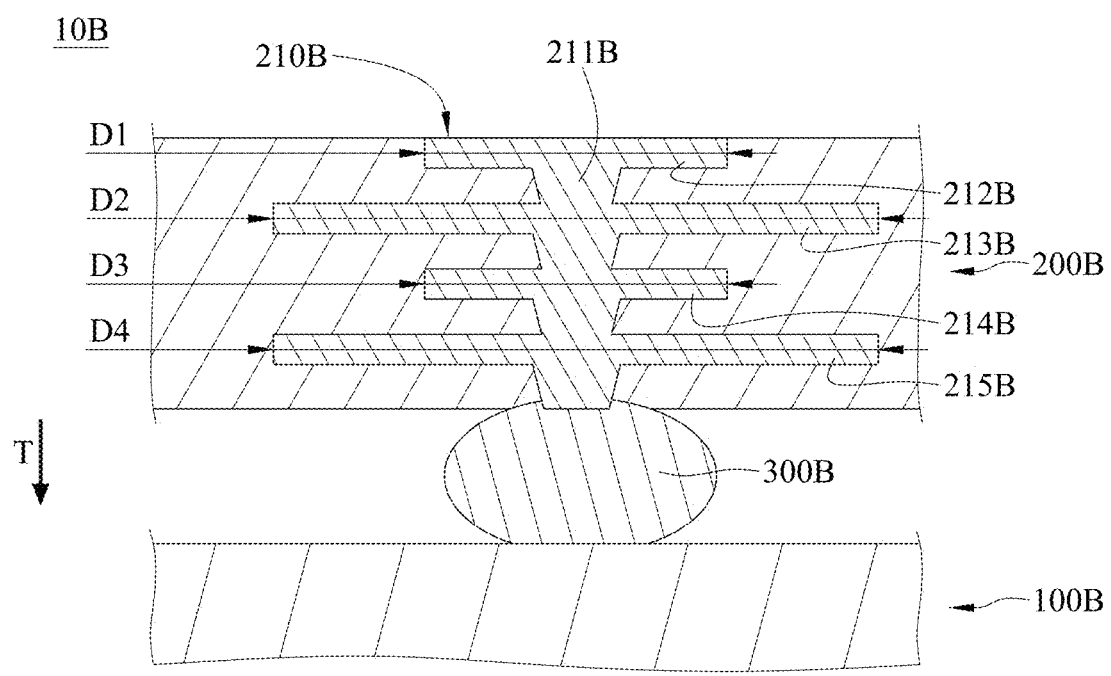
FIG. 9 is a partial and enlarged view of a conductive circuit carrier module according to a second embodiment of the disclosure.

Please refer to FIG. 9, which is a partial and enlarged view of a conductive circuit carrier module 10B according to a second embodiment of the disclosure. The conductive circuit carrier module 10B provided in one embodiment includes a carrier 100B, a conductive circuit film layer 200B, and a plurality of conductive structures 300B. The carrier 100B, the conductive circuit film layer 200B, and the conductive structures 300B in the embodiment and the carrier 100, the conductive circuit film layer 200, and the conductive structures 300 in the previous embodiment are similar in structure and connection relationship, and therefore differences between this and previous embodiments will be illustrated hereinafter.

In the embodiment, as shown in FIG. 9, the conductive circuit film layer 200B has a conductive circuit structure 210B electrically connected to a conductive circuit (not shown) of the carrier 100B via one of the conductive structures 300B. The conductive circuit structure 210B includes a vertical wire part 211B and a plurality of horizontal wire parts 212B, 213B, 214B and 215B. The vertical wire part 211B extends along a thickness direction T of the conductive circuit film layer 200B. The horizontal wire parts 212B, 213B, 214B and 215B each extend outward from the vertical wire part 211B along a direction substantially perpendicular to the vertical wire part 211B. In other words, the horizontal wire parts 212B, 213B, 214B and 215B extend along a direction substantially perpendicular to the thickness direction T, the horizontal wire parts 212B, 213B, 214B and 215B are connected to one another via the vertical wire part 211B, and the vertical wire part 211B can be served as a supporter for the horizontal wire parts 212B, 213B, 214B and 215B. In one embodiment, for example, the horizontal wire parts 212B, 213B, 214B, and 215B may be four parts. The horizontal wire parts 212B, 213B, 214B, and 215B may include a first horizontal wire part 212B, a second horizontal wire part 213B, a third horizontal wire part 214B, and a fourth horizontal wire part 215B. The first horizontal wire part 212B is located farther away from the carrier 100B than the second horizontal wire part 213B, the second horizontal wire part 213B is located farther away from the carrier 100B than the third horizontal wire part 214B, and the third horizontal wire part 214B is located farther away from the carrier 100B than the fourth horizontal wire part 215B. In other words, the first horizontal wire part 212B is the farthest from the carrier 100B, the fourth horizontal wire part 215B is the closest to the carrier 100B, and the second horizontal wire part 213B and the third horizontal wire part 214B are located between the first horizontal wire part 212B and the fourth horizontal wire part 215B.

In FIG. 9, D1 denotes to the length of the first horizontal wire part 212B, D2 denotes to the length of the second horizontal wire part 213B, D3 denotes to the length of the third horizontal wire part 214B, D4 denotes to the length of the fourth horizontal wire part 215B, and D1:D2:D3:D4=1: 2:1:2. This arrangement of the horizontal wire parts 212B, 213B, 214B, and 215B is favorable for reducing or preventing unwanted warpage from occurring on the conductive circuit film layer 200B. In other words, the arrangement of the horizontal wire parts 212B, 213B, 214B, and 215B enhances the flatness of the surface of the conductive circuit film layer 200B of the conductive circuit carrier module 10B, for example, the warpage less than 200 um, thereby optimizing or facilitating the later process, such as chip installation. The conductive structure 300B may be a copper-core solder ball or a solder ball with an under bump metallurgy (UBM).

Figure 10:
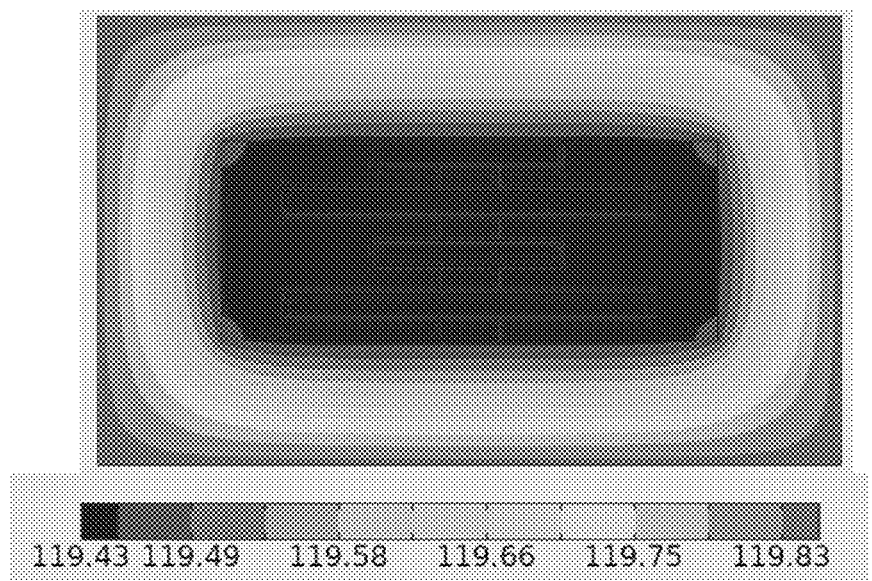
FIG. 10 to FIG. 12 depict the simulation of the conductive circuit carrier module of FIG. 9.
Figure 11:
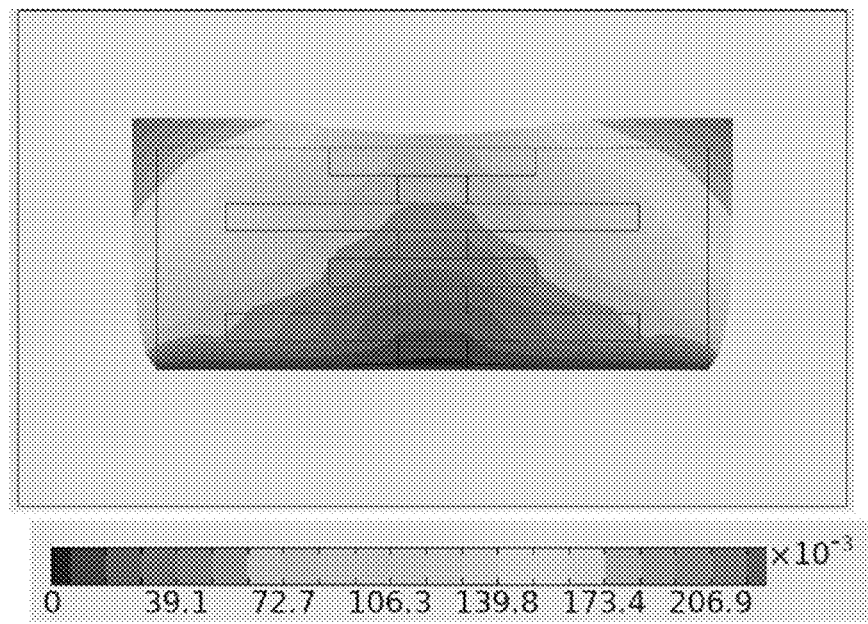
Figure 12:
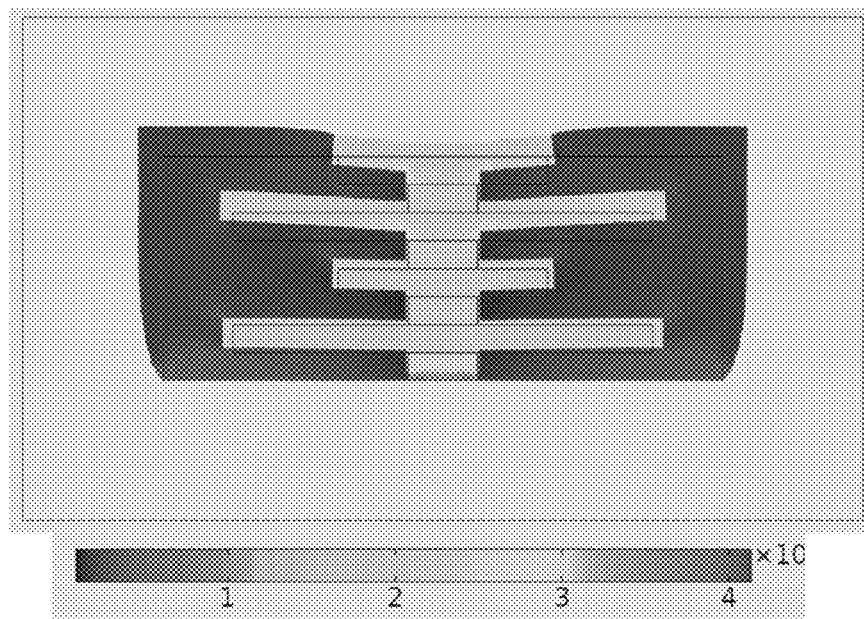

Then, please see the simulations of the conductive circuit carrier module 10B as illustrated in FIGS. 10-12, where FIG. 10 shows a temperature distribution of the conductive circuit carrier module 10B, FIG. 11 shows a displacement distribution of the conductive circuit carrier module 10B, and FIG. 12 shows a stress distribution of the conductive circuit carrier module 10B.

In FIG. 10, the temperature at the conductive circuit structure 210B of the conductive circuit film layer 200B is about 119.43 degrees Celsius. In FIG. 11, the displacement at a side of the conductive circuit film layer 200B located close to the conductive structure 300B is about 0 micrometer (um), and the displacement at a side of the conductive circuit film layer 200B located away from the conductive structure 300B is about 0.140 micrometers. In FIG. 12, from a side of the conductive circuit structure 210B of the conductive circuit film layer 200B located close to the conductive structure 300B to the other side of the conductive circuit structure 210B of the conductive circuit film layer 200B located away from the conductive structure 300B, the stress applied thereto gradually decreases from about 40 N/m² to about 20 N/m².

Figure 13:
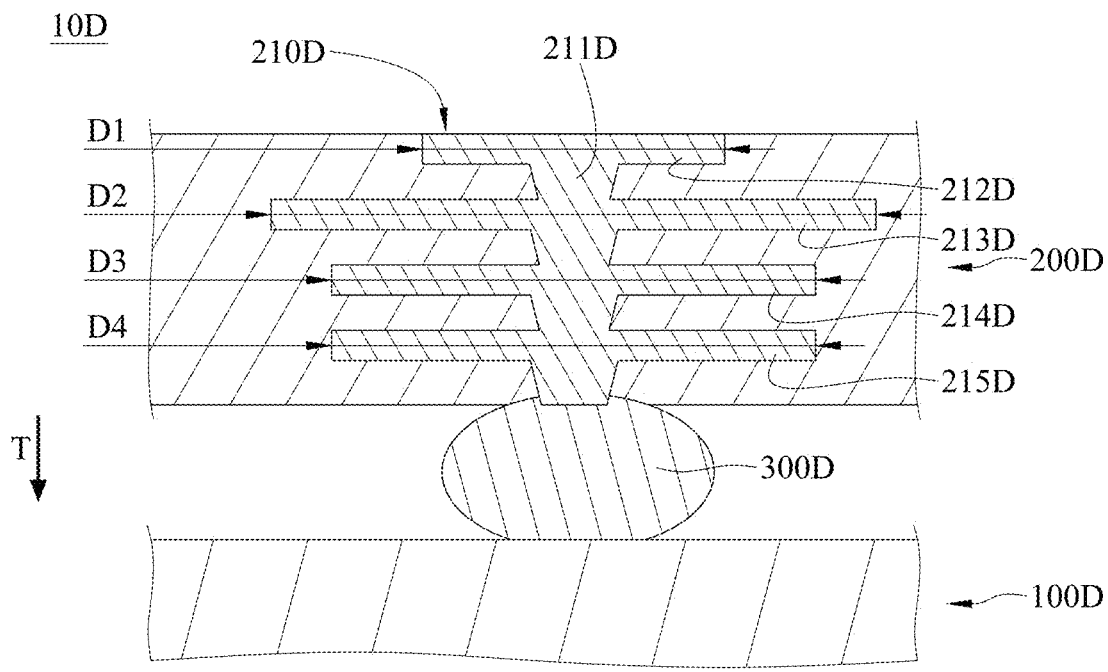
FIG. 13 is a partial and enlarged view of a conductive circuit carrier module according to a third embodiment of the disclosure.

Please refer to FIG. 13, which is a partial and enlarged view of a conductive circuit carrier module 10D according to a third embodiment of the disclosure. The conductive circuit carrier module 10D provided in one embodiment includes a carrier 100D, a conductive circuit film layer 200D, and a plurality of conductive structures 300D. The carrier 100D, the conductive circuit film layer 200D, and the conductive structures 300D in the embodiment and the carrier 100, the conductive circuit film layer 200, and the conductive structures 300 in the previous embodiment are similar in structure and connection relationship, and therefore differences between this and previous embodiments will be illustrated hereinafter.

In the embodiment, as shown in FIG. 13, the conductive circuit film layer 200D has a conductive circuit structure 210D electrically connected to a conductive circuit (not shown) of the carrier 100D via one of the conductive structures 300D. The conductive circuit structure 210D includes a vertical wire part 211D and a plurality of horizontal wire parts 212D, 213D, 214D and 215D. The vertical wire part 211D extends along a thickness direction T of the conductive circuit film layer 200D. The horizontal wire parts 212D, 213D, 214D and 215D each extend outward from the vertical wire part 211D along a direction substantially perpendicular to the vertical wire part 211D. In other words, the horizontal wire parts 212D, 213D, 214D and 215D extend along a direction substantially perpendicular to the thickness direction T, the horizontal wire parts 212D, 213D, 214D and 215D are connected to one another via the vertical wire part 211D, and the vertical wire part 211D can be served as a supporter for the horizontal wire parts 212D, 213D, 214D and 215D. In one embodiment, for example, the horizontal wire parts 212D, 213D, 214D, and 215D may be four parts. The horizontal wire parts 212D, 213D, 214D, and 215D may include a first horizontal wire part 212D, a second horizontal wire part 213D, a third horizontal wire part 214D, and a fourth horizontal wire part 215D. The first horizontal wire part 212D is located farther away from the carrier 100D than the second horizontal wire part 213D, the second horizontal wire part 213D is located farther away from the carrier 100D than the third horizontal wire part 214D, and the third horizontal wire part 214D is located farther away from the carrier 100D than the fourth horizontal wire part 215D. In other words, the first horizontal wire part 212D is the farthest from the carrier 100D, the fourth horizontal wire part 215D is the closest to the carrier 100D, and the second horizontal wire part 213D and the third horizontal wire part 214D are located between the first horizontal wire part 212D and the fourth horizontal wire part 215D.

In FIG. 13, D1 denotes to the length of the first horizontal wire part 212D, D2 denotes to the length of the second horizontal wire part 213D, D3 denotes to the length of the third horizontal wire part 214D, D4 denotes to the length of the fourth horizontal wire part 215D, and D1:D2:D3:D4=1:2:1.6:1.6. This arrangement of the horizontal wire parts 212D, 213D, 214D, and 215D is favorable for reducing or preventing unwanted warpage from occurring on the conductive circuit film layer 200D. In other words, the arrangement of the horizontal wire parts 212D, 213D, 214D, and 215D enhances the flatness of the surface of the conductive circuit film layer 200D of the conductive circuit carrier module 10D, for example, the warpage less than 200 um, thereby optimizing or facilitating the later process, such as chip installation.

Figure 14:
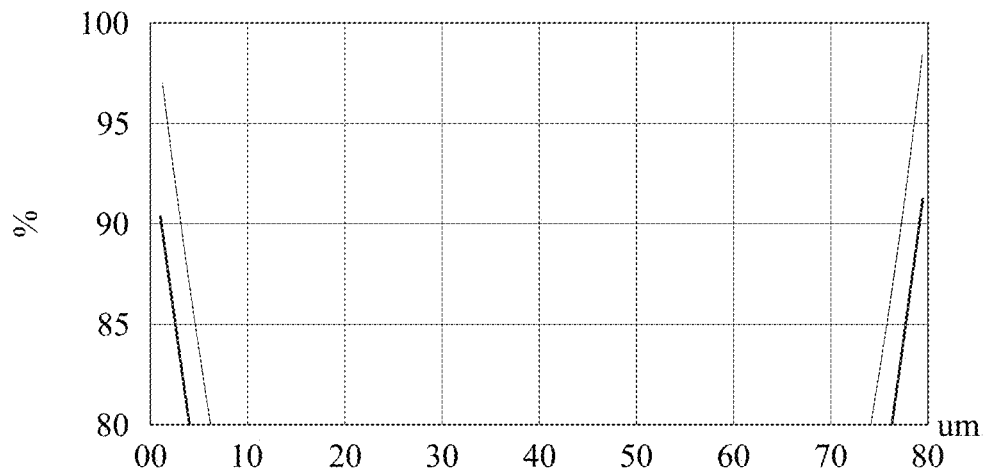
FIG. 14 to FIG. 17 depict the simulation of the conductive circuit carrier module of FIG. 5 and FIG. 9.
Figure 15:
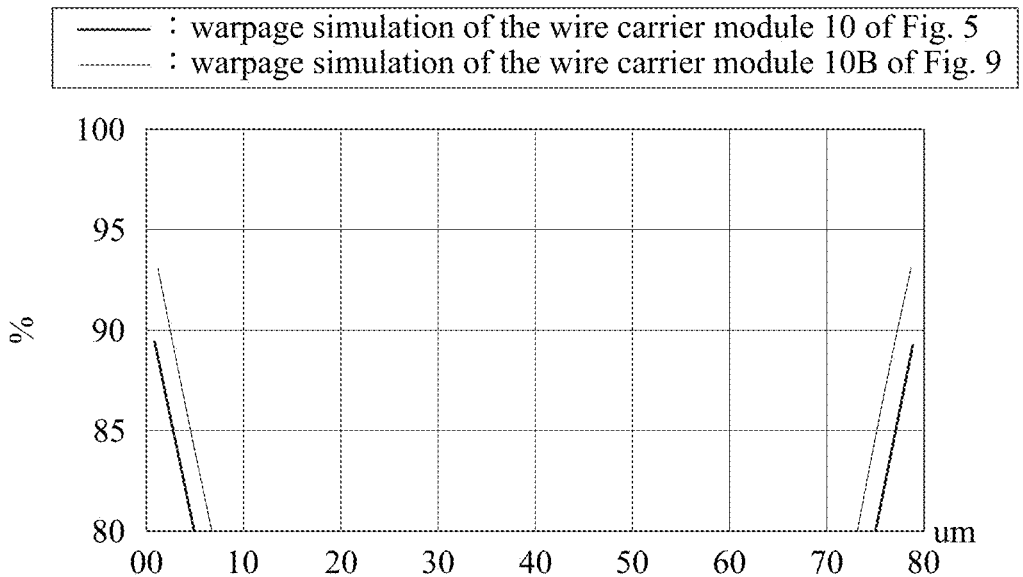
Figure 16:
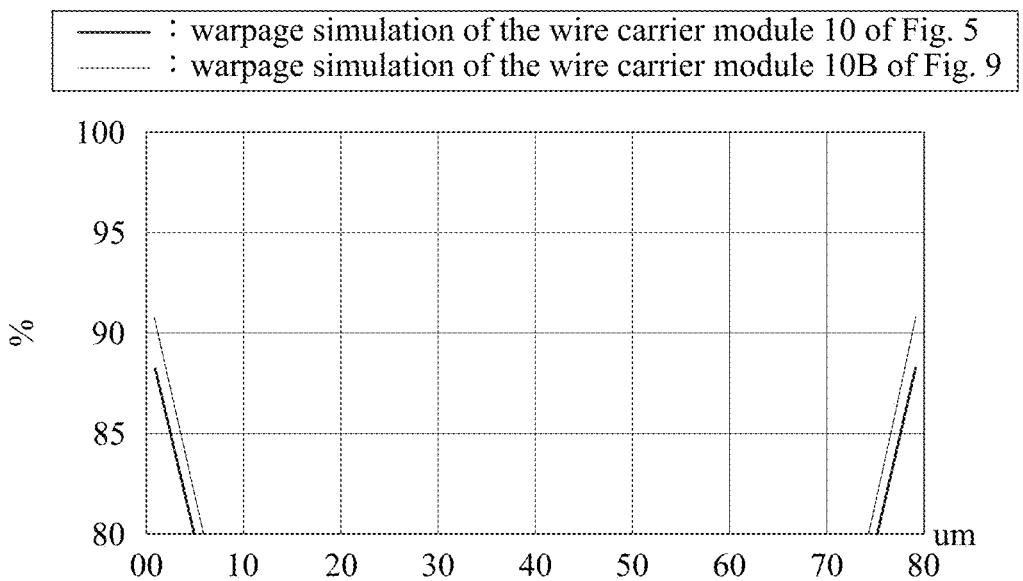
Figure 17:
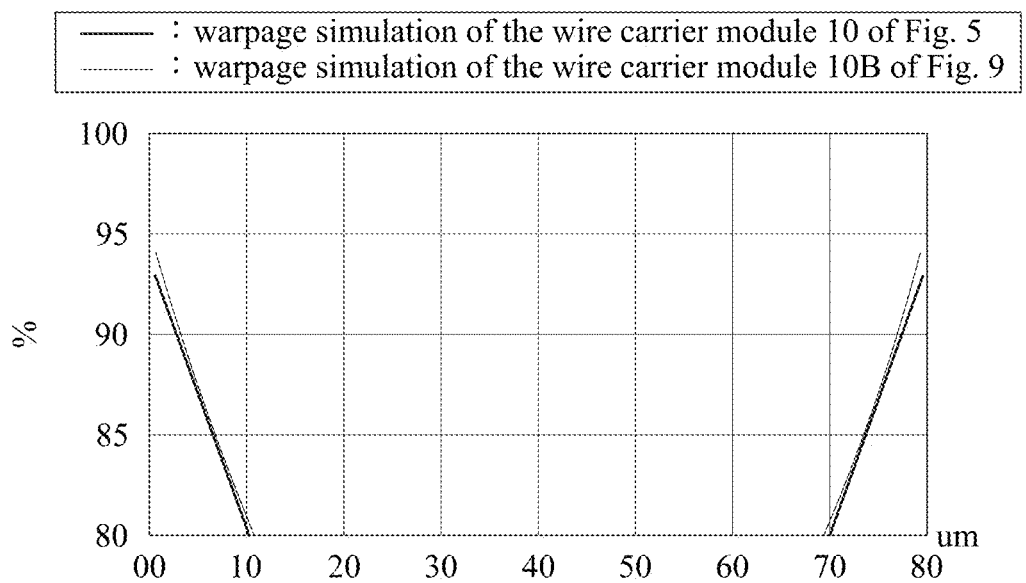

Please see the simulations of the conductive circuit carrier modules 10 and 10B as illustrated in FIGS. 14-17. In specific, FIG. 14 shows the warpage of the fourth horizontal wire parts along the horizontal direction, FIG. 15 shows the warpage of the third horizontal wire parts along the horizontal direction, FIG. 16 shows the warpage of the second horizontal wire parts along the horizontal direction, and FIG. 17 shows the warpage of the first horizontal wire parts along the horizontal direction, where the horizontal axis refers to the length of the conductive circuit carrier module in a direction perpendicular to the thickness of the conductive circuit carrier module (unit: micrometer, um), and the vertical axis refers to the percentage of warpage to that of a conventional carrier (unit: %). As shown, the warpage of the conductive circuit carrier modules 10 and 10B are both lesser than hundred percent. That is, the conductive circuit carrier modules in FIGS. 5 and 9 have a lesser deformation compared to the conventional carrier. In addition, the conductive circuit carrier module in FIG. 5 has a lesser deformation than that in FIG. 9.

The abovementioned embodiments are exemplary. In some other embodiments, a conductive circuit carrier module may include a carrier and a conductive circuit film layer. The conductive circuit film layer is disposed on the carrier. The conductive circuit film layer has at least one conductive circuit structure including a vertical wire part and at least four horizontal wire parts. The vertical wire part extends along a thickness direction of the conductive circuit film layer. The at least four horizontal wire parts are connected to one another via the vertical wire part and extend along a direction substantially perpendicular to the vertical wire part. At least two of the at least four horizontal wire parts are different in length. As shown in FIG. 5, the length of the first horizontal wire part is different from the length of the second horizontal wire part.

Further, two of the at least four horizontal wire parts that are respectively located closest to the carrier and located farthest away from the carrier are defined as outer wire parts, and at least two of the at least four horizontal wire parts that are located between the outer wire parts are defined as inner wire parts. One of the outer wire parts has a length shorter than or equal to a length of each of the inner wire parts. As shown in FIG. 5, the length of the first horizontal wire part is less than the sum of the length of the second horizontal wire part and the length of the third horizontal wire part.

Alternatively, in some other embodiment, a conductive circuit carrier module may include a carrier and a conductive circuit film layer. The conductive circuit film layer is disposed on the carrier. The conductive circuit film layer has at least one conductive circuit structure including a vertical wire part and at least four horizontal wire parts. The vertical wire part extends along a thickness direction of the conductive circuit film layer. The at least four horizontal wire parts are connected to one another via the vertical wire part and extend along a direction substantially perpendicular to the vertical wire part. Two of the at least four horizontal wire parts that are respectively located closest to the carrier and located farthest away from the carrier are defined as outer wire parts, and at least two of the at least four horizontal wire parts that are located between the outer wire parts are defined as inner wire parts. A ratio of areas of the outer wire parts to areas of the at least four horizontal wire parts is less than a ratio of areas of the inner wire parts to the areas of the at least four horizontal wire parts. As shown in FIG. 5, a ratio of areas of the outer wire parts (the first horizontal wire part and the fourth horizontal wire part) to areas of the four horizontal wire parts is less than a ratio of areas of the inner wire parts (the second horizontal wire part and the third horizontal wire part) to areas of the four horizontal wire parts.

According to the conductive circuit carrier module discussed above, by the coral-shaped arrangement of the horizontal wire parts, it is favorable for reducing or preventing unwanted warpage from occurring on the conductive circuit film layer. In other words, the arrangement of the horizontal wire parts enhances the flatness of the surface of the conductive circuit film layer of the conductive circuit carrier module, for example, the warpage less than 200 um, thereby optimizing or facilitating the later process, such as chip installation.

Further, the first horizontal wire part, the second horizontal wire part, the third horizontal wire part, and the fourth horizontal wire part are in length by the arrangement where at least two horizontal wire parts are different, it is favorable for further reducing or preventing unwanted warpage from occurring on the conductive circuit film layer.

Furthermore, by the arrangement where lengths among the first horizontal wire part, the second horizontal wire part, the third horizontal wire part, and the fourth horizontal wire part are in a ratio (D1:D2:D3:D4) of 1:2:2:1, 1:2:1:2, or 1:2:1.6:1.6, it is favorable for further reducing or preventing unwanted warpage from occurring on the conductive circuit film layer.

Furthermore, by the arrangement where one of the outer wire parts has a length shorter than or equal to a length of each of the inner wire parts, it is favorable for further reducing or preventing unwanted warpage from occurring on the conductive circuit film layer.

Furthermore, by the arrangement where the four horizontal wire parts are symmetrically arranged or asymmetrically arranged with respect to the vertical wire part, it is favorable for further reducing or preventing unwanted warpage from occurring on the conductive circuit film layer.

Furthermore, by the arrangement where a ratio of areas of the outer wire parts to areas of the at least four horizontal wire parts is less than a ratio of areas of the inner wire parts to the areas of the at least four horizontal wire parts, it is favorable for further reducing or preventing unwanted warpage from occurring on the conductive circuit film layer.

The embodiments are chosen and described in order to best explain the principles of the disclosure and its practical applications, to thereby enable others skilled in the art best utilize the disclosure and various embodiments with various modifications as are suited to the particular use being contemplated. It is intended that the scope of the disclosure is defined by the following claims and their equivalents.

What is claimed is:

1. A conductive circuit carrier module, comprising:
a carrier; and
a conductive circuit film layer, disposed on the carrier, wherein the conductive circuit film layer has at least one conductive circuit structure comprising a vertical wire part and at least four horizontal wire parts, the vertical wire part extends along a thickness direction of the conductive circuit film layer, the at least four horizontal wire parts are connected to one another via the vertical wire part and extend along a direction substantially perpendicular to the vertical wire part;
wherein the at least four horizontal wire parts are symmetrically arranged or asymmetrically arranged with respect to the vertical wire part;
wherein the at least four horizontal wire parts comprise a first horizontal wire part, a second horizontal wire part, a third horizontal wire part, and a fourth horizontal wire part, the first horizontal wire part is located farther away from the carrier than the second horizontal wire part, the second horizontal wire part is located farther away from the carrier than the third horizontal wire part, the third horizontal wire part is located farther away from the carrier than the fourth horizontal wire part, and lengths among the first horizontal wire part, the second horizontal wire part, the third horizontal wire part, and the fourth horizontal wire part are in a ratio of 1:2:2:1.

2. The conductive circuit carrier module according to claim 1, further comprising at least one conductive structure, wherein the at least one conductive circuit structure is electrically connected to the carrier via the at least one conductive structure.

3. The conductive circuit carrier module according to claim 1, further comprising a plurality of conductive structures, wherein the at least one conductive circuit structure is electrically connected to the carrier via one of the plurality of conductive structures.

4. The conductive circuit carrier module according to claim 1, wherein two of the at least four horizontal wire parts that are respectively located closest to the carrier and located farthest away from the carrier are outer wire parts, at least two of the at least four horizontal wire parts that are located between the outer wire parts are inner wire parts, and one of the outer wire parts has a length shorter than or equal to a length of each of the inner wire parts.

5. The conductive circuit carrier module according to claim 1, wherein two of the at least four horizontal wire parts that are respectively located closest to the carrier and located farthest away from the carrier are outer wire parts, at least two of the at least four horizontal wire parts that are located between the outer wire parts are inner wire parts, and a ratio of areas of the outer wire parts to areas of the at least four horizontal wire parts is less than a ratio of areas of the inner wire parts to the areas of the at least four horizontal wire parts.

6. The conductive circuit carrier module according to claim 1, further comprising at least one conductive structure which is a copper-core solder ball.

7. The conductive circuit carrier module according to claim 1, further comprising at least one conductive structure which is a solder ball with an under bump metallurgy.

8. A conductive circuit carrier module, comprising:
a carrier; and
a conductive circuit film layer, disposed on the carrier, wherein the conductive circuit film layer has at least one conductive circuit structure comprising a vertical wire part and at least four horizontal wire parts, the vertical wire part extends along a thickness direction of the conductive circuit film layer, the at least four horizontal wire parts are connected to one another via the vertical wire part and extend along a direction substantially perpendicular to the vertical wire part;
wherein at least two of the at least four horizontal wire parts are different in length;
wherein the at least four horizontal wire parts comprise a first horizontal wire part, a second horizontal wire part, a third horizontal wire part, and a fourth horizontal wire part, the first horizontal wire part is located farther away from the carrier than the second horizontal wire part, the second horizontal wire part is located farther away from the carrier than the third horizontal wire part, the third horizontal wire part is located farther away from the carrier than the fourth horizontal wire part, and lengths among the first horizontal wire part, the second horizontal wire part, the third horizontal wire part, and the fourth horizontal wire part are in a ratio of 1:2:2:1.

9. The conductive circuit carrier module according to claim 8, further comprising at least one conductive structure, wherein the at least one conductive circuit structure is electrically connected to the carrier via the at least one conductive structure.

10. The conductive circuit carrier module according to claim 8, further comprising a plurality of conductive structures, wherein the at least one conductive circuit structure is electrically connected to the carrier via one of the plurality of conductive structures.

11. The conductive circuit carrier module according to claim 8, wherein two of the at least four horizontal wire parts that are respectively located closest to the carrier and located farthest away from the carrier are outer wire parts, at least two of the at least four horizontal wire parts that are located between the outer wire parts are inner wire parts, and one of the outer wire parts has a length shorter than or equal to a length of each of the inner wire parts.

12. The conductive circuit carrier module according to claim 8, further comprising at least one conductive structure which is a copper-core solder ball.

13. The conductive circuit carrier module according to claim 8, further comprising at least one conductive structure which is a solder ball with an under bump metallurgy.

14. A conductive circuit carrier module, comprising:
a carrier; and
a conductive circuit film layer, disposed on the carrier, wherein the conductive circuit film layer has at least one conductive circuit structure comprising a vertical wire part and at least four horizontal wire parts, the vertical wire part extends along a thickness direction of the conductive circuit film layer, the at least four horizontal wire parts are connected to one another via the vertical wire part and extend along a direction substantially perpendicular to the vertical wire part;

wherein two of the at least four horizontal wire parts that are respectively located closest to the carrier and located farthest away from the carrier are outer wire parts, at least two of the at least four horizontal wire parts that are located between the outer wire parts are inner wire parts, and a ratio of areas of the outer wire parts to areas of the at least four horizontal wire parts is less than a ratio of areas of the inner wire parts to the areas of the at least four horizontal wire parts;

wherein the at least four horizontal wire parts comprise a first horizontal wire part, a second horizontal wire part, a third horizontal wire part, and a fourth horizontal wire part, the first horizontal wire part is located farther away from the carrier than the second horizontal wire part, the second horizontal wire part is located farther away from the carrier than the third horizontal wire part, the third horizontal wire part is located farther away from the carrier than the fourth horizontal wire part, and lengths among the first horizontal wire part, the second horizontal wire part, the third horizontal wire part, and the fourth horizontal wire part are in a ratio of 1:2:2:1.

15. A conductive circuit carrier module, comprising:
a carrier;
a conductive circuit film layer, disposed on the carrier, wherein the conductive circuit film layer has at least one conductive circuit structure comprising a vertical wire part and at least four horizontal wire parts, the vertical wire part extends along a thickness direction of the conductive circuit film layer, the at least four horizontal wire parts are connected to one another via the vertical wire part and extend along a direction substantially perpendicular to the vertical wire part; and
at least one conductive structure, wherein the at least one conductive circuit structure is electrically connected to the carrier via the at least one conductive structure, and the at least one conductive structure is directly connected to and located between the carrier and the vertical wire part that protrudes from one of the at least four horizontal wire parts;
wherein the at least four horizontal wire parts are symmetrically arranged or asymmetrically arranged with respect to the vertical wire part.

16. A conductive circuit carrier module, comprising:
a carrier;
a conductive circuit film layer, disposed on the carrier, wherein the conductive circuit film layer has at least one conductive circuit structure comprising a vertical wire part and at least four horizontal wire parts, the vertical wire part extends along a thickness direction of the conductive circuit film layer, the at least four horizontal wire parts are connected to one another via the vertical wire part and extend along a direction substantially perpendicular to the vertical wire part; and
at least one conductive structure, wherein the at least one conductive circuit structure is electrically connected to the carrier via the at least one conductive structure, and the at least one conductive structure is directly connected to and located between the carrier and the vertical wire part that protrudes from one of the at least four horizontal wire parts;
wherein at least two of the at least four horizontal wire parts are different in length.

17. A conductive circuit carrier module, comprising:
a carrier; and
a conductive circuit film layer, disposed on the carrier, wherein the conductive circuit film layer has at least one conductive circuit structure comprising a vertical wire part and at least four horizontal wire parts, the vertical wire part extends along a thickness direction of the conductive circuit film layer, the at least four horizontal wire parts are connected to one another via the vertical wire part and extend along a direction substantially perpendicular to the vertical wire part; and
at least one conductive structure, wherein the at least one conductive circuit structure is electrically connected to the carrier via the at least one conductive structure, and the at least one conductive structure is directly connected to and located between the carrier and the vertical wire part that protrudes from one of the at least four horizontal wire parts;
wherein two of the at least four horizontal wire parts that are respectively located closest to the carrier and located farthest away from the carrier are outer wire parts, at least two of the at least four horizontal wire parts that are located between the outer wire parts are inner wire parts, and a ratio of areas of the outer wire parts to areas of the at least four horizontal wire parts is less than a ratio of areas of the inner wire parts to the areas of the at least four horizontal wire parts.

* * * * *